United States Patent [19]

Driscoll et al.

[11] 4,245,150

[45] Jan. 13, 1981

[54] POWER LINE DISTURBANCE DETECTOR CIRCUIT

[75] Inventors: Carleton D. Driscoll; James N. Hobbs, Jr., both of Cary, N.C.

[73] Assignee: International Business Machines Corporation, Armonk, N.Y.

[21] Appl. No.: 15,268

[22] Filed: Feb. 26, 1979

[51] Int. Cl.³ .......................... G06M 3/12; H02H 3/24
[52] U.S. Cl. .......................... 235/92 FP; 235/92 PE; 340/663; 361/92; 364/900
[58] Field of Search ......... 235/92 FP, 92 PE, 92 EC, 235/92 EL; 328/48; 340/510, 511, 660, 663; 365/228; 364/200 MS File, 900 MS File; 361/86, 92

[56] References Cited

U.S. PATENT DOCUMENTS

| | | | |
|---|---|---|---|
| 3,852,731 | 12/1974 | Hollands | 361/92 |
| 3,885,199 | 5/1975 | Nohara et al. | 361/86 |
| 3,937,937 | 2/1976 | McVey | 361/92 |
| 3,944,889 | 3/1976 | Conway | 340/663 |
| 4,031,463 | 6/1977 | Norberg | 361/86 |
| 4,089,058 | 5/1978 | Murdock | 235/92 FP |

Primary Examiner—Joseph M. Thesz
Attorney, Agent, or Firm—Gerald R. Woods

[57] ABSTRACT

A power line disturbance (PLD) detector circuit includes a digital counter which is driven by pulses provided by a clock in an associated data processing system. The PLD detector circuit includes a comparator amplifier for comparing primary AC power to a DC reference voltage on a cycle-by-cycle basis. The amplifier generates a reset pulse once during each AC cycle as long as the AC voltage exceeds the DC reference voltage. When a decoder circuit detects a count outside the range of counts attained by the digital counter between normally occurring reset pulses, the decoder circuit responds by generating a PLD signal. The PLD signal is provided both to the associated data processing system and to a Power On Reset circuit. The Power On Reset circuit is initialized by the PLD signal, permitting the circuit to respond consistently upon subsequent restoration of power.

8 Claims, 2 Drawing Figures

POWER LINE DISTURBANCE DETECTOR CIRCUIT

TECHNICAL FIELD

The present invention relates to data processing systems and more particularly to a circuit for generating a power line disturbance signal which initiates data save operations in the event of a power outage.

PRIOR ART

Data being manipulated in an electronic data processing system exists for the most part in volatile form only. Such data will be lost or badly garbled if electrical power to the system is removed.

When the loss of power can be foreseen, as when the data processing system is shut down for maintenance or at the end of normal business hours, routine operations are performed to save all volatile data by transferring it to non-volatile storage media such as magnetic discs or magnetic tapes.

There are times, however, when a loss of system power cannot be foreseen. The primary source of power may fail for periods of time ranging from a cycle or two to several days as a result of weather conditions, overloads, etc. It is important that the data processing system be capable of recognizing and responding to these power line disturbances as quickly as possible to provide a maximum amount of time for an orderly transfer of volatile data to non-volatile storage.

Sometimes, power line disturbances are extremely brief in nature. To minimize the down time of the system, it is also important that the system be able to respond consistently to signals indicating that system power has been restored following a power line disturbance.

In many prior art systems, the same circuit performs the power on reset and power line disturbance detection functions. The circuit includes a comparator amplifier having a first input connected to a system power source through a resistive voltage divider. A second input to the comparator amplifier is connected to the system power source through an RC charging circuit. When the power is first applied to the system, the voltage at the first input will rise immediately while the voltage at the second input will rise at a slower rate dependent upon the time constant of the charging circuit. After a predetermined delay, the voltage on the second input will exceed the voltage on the first input, causing the comparator amplifier output to switch. The new amplifier output signal serves as the power on reset signal.

If system power is lost, the first input to the amplifier will drop immediately while the second input will drop at a slower rate as the capacitor discharges. When the capacitor has discharged to a predetermined level, the amplifier output will switch, providing a power line disturbance signal which can be used to initiate data save operations.

There are a number of drawbacks to such a dual function circuit. First, the requirements for the two functions performed by the circuit are inconsistent. To give the system voltages time to stabilize when power is first applied, the time constant to the RC charging circuit should be relatively large. If the time constant is large, however, the capacitor will discharge slowly in the event of a power line disturbance. Consequently, the PLD signal will be generated later than it ideally should be. Obviously, the response of the circuit to a power line disturbance could be improved by reducing the time constant of the charging circuit. This necessarily shortens the time available to stabilize the system DC voltages when power is applied to the system.

Another known problem with the conventional dual function circuit is that it does not respond reliably if the power outage is brief. If the power line disturbance lasts only briefly, the timing capacitor will not have time to fully discharge. Consequently, when power is restored, the timing capacitor will reach the switching level too early causing a premature reset signal to be generated. If the system DC voltages have not stabilized, the premature reset signal may result in errors in the system operation.

Another problem with a dual function circuit is the variation in timing periods due to tolerances of passive components. Unless expensive, low tolerance components are employed, different systems will respond at different times when power is applied to or removed from the system.

There are known variations of the basic dual function circuit. In one such variant circuit, the RC charging circuit includes a second resistor in parallel with the time capacitor. The output of the comparator amplifier provides a switching voltage for a transistor connected across a capacitor in a second RC charging circuit. The second RC charging circuit is connected to a system DC power source and provides one input to a second comparator amplifier. The other input to the comparator amplifier is a purely resistive voltage divider also connected to the DC power source.

The passive components at the inputs to the second comparator amplifier perform the timing functions for the power on reset/power line disturbance detection. The first comparator amplifier and its associated circuitry are used to discharge the second timing capacitor quickly in the event of a power line disturbance so that a POR signal will be generated only after a fixed delay regardless how long or short the power interruption may be.

While this circuit solves the problem of premature restart, the response time of the system to a power line disturbance can still vary widely due to the tolerances of the passive components.

In another known type of primary power fault detector, electrical signals depending upon the algebraic values of the power voltage and power current are mulitplied. When the power fails, the multiplier output will indicate a power flow reversal. A retriggerable one-shot is used in conjunction with a NAND gate to detect the instantaneous voltage drop to zero and the current reversal in order to generate a power fault signal.

It is not clear that this power fault detector will respond reliably in a power brown-out; that is, where the frequency of the primary AC power is maintained while its magnitude is reduced due to overload conditions. Moreover, it appears that the response time of the power fault detector circuit is fixed and cannot be adjusted to accommodate data processing systems having different requirements. For example, one type of data processing system may be able to tolerate power outages of longer duration than another type of system. It is desirable that the power failure detection be tailored to the system's level of power failure tolerance.

SUMMARY

The present invention is a highly responsive power line disturbance detector having operating characteristics which can be easily adjusted for use with systems having different tolerances to power line disturbances.

A power line disturbance detector constructed in accordance with the present invention includes a comparator circuit for comparing an AC power voltage to a DC reference voltage. The comparator circuit produces a reset pulse each time a peak value of the AC voltage exceeds a threshold value established by the DC reference voltage. The power line disturbance detector also includes a digital counter which is incremented by a clock source in the data processing system with which the detector is associated. The counter is incremented at a rate dependent upon the system clock and is reset to a predetermined initial count by each reset pulse provided by the comparator circuit. A decoder means at the ouput of the digital counter responds at a predetermined trigger count to generate a power line disturbance signal. The trigger count is beyond the range of counts attained between normally occuring reset pulses and is reached only in the event of an AC power failure.

BRIEF DESCRIPTION OF THE DRAWINGS

While the specification concludes with claims particularly pointing out and distinctly claiming that which is regarded as the present invention, details of a preferred embodiment of the invention, may be more readily ascertained from the following detailed description when read in conjunction with the accompanying drawings wherein:

DETAILED DESCRIPTION

Figure 1:
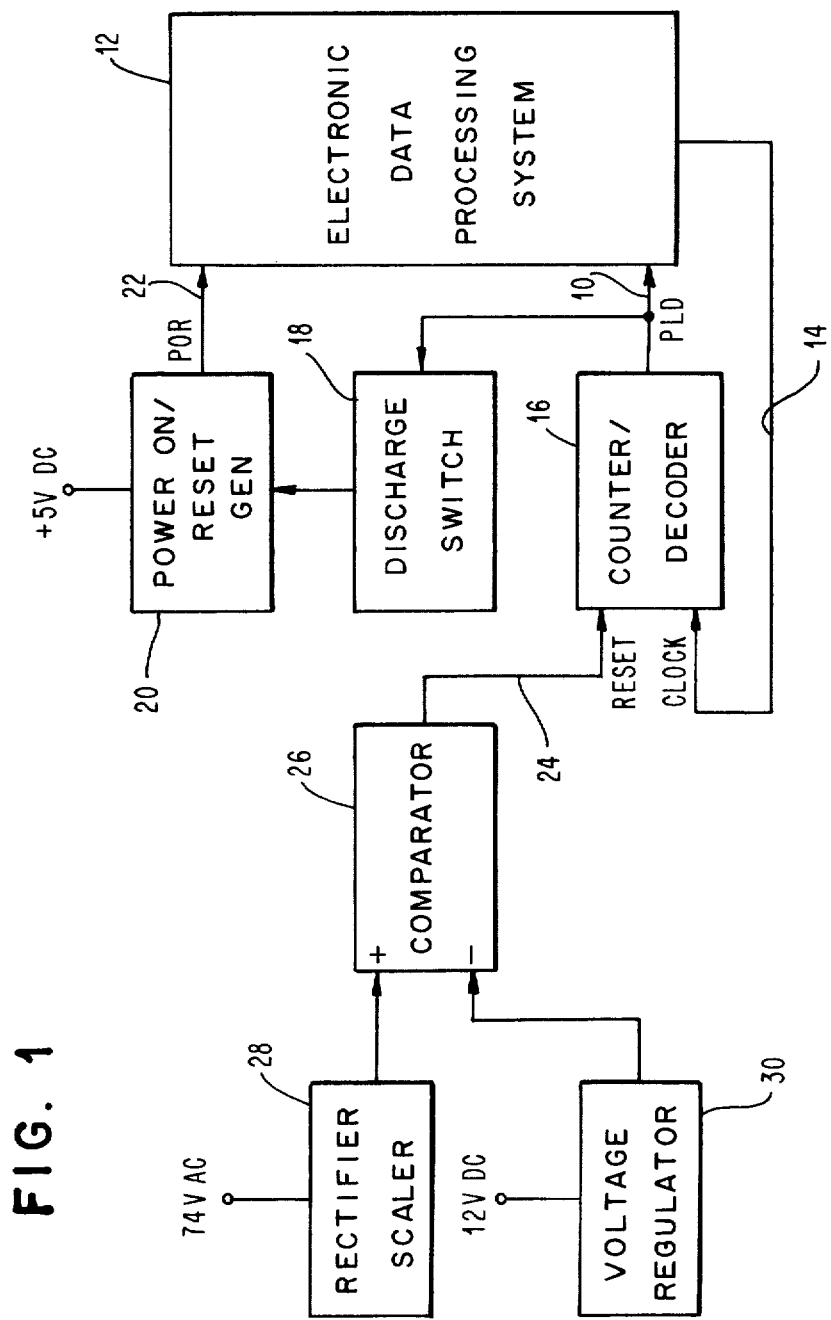
FIG. 1 is a block diagram of a power line disturbance detector circuit constructed in accordance with the present invention.

Referring to FIG. 1, a detector circuit constructed in accordance with the present invention is used to provide a power line disturbance (PLD) signal on an input line 10 to an electronic data processing system, shown only as a block 12. The system 12, which may be conventional in nature, includes one or more clock circuits for producing clock pulses at accurately controlled rates. Clock pulses generated at one of these sources are applied to the PLD circuit through an output line 14 from the system 12. The clock pulses are used to increment a counter/decoder circuit 16, which will be discussed in more detail later. The PLD signal line 10 at the output of counter/decoder circuit 16 is used to control a discharge switch 18 associated with a Power On Reset pulse generator circuit 20. A Power On Reset (POR) signal on an output line 22 from circuit 20 is fed back to the system 12 to initialize system registers and counters when system power is restored.

A reset input 24 to the counter/decoder circuit 16 is provided by a comparator circuit 26 which compares an AC signal provided by a rectifier/scaler circuit 28 with a regulated DC voltage provided by a voltage regulator circuit 30. The rectifier/scaler circuit 28 is driven by the primary AC power source for the system. The AC power is rectified and scaled down before being compared with a threshold voltage provided by the voltage regulator 30. As long as AC power is maintained at the normal values, the amplitude of the signal provided by rectifier/scaler circuit 28 exceeds the DC threshold level at least once during each cycle of primary AC power. The output of comparator circuit 26 changes accordingly as long as AC power is maintained to provide at least one reset pulse during each AC power cycle.

The reset pulse resets the counter section of counter/decoder 16 to a predetermined initial value, preferably 0. The counter section will immediately begin to count up at a rate determined by the clock pulses provided from the system 12 over line 14. The decoder section of counter/decoder circuit 16 is responsive at a predetermined trigger count to provide the PLD signal on line 10. The trigger count is beyond the range of counts attained between normally occurring reset pulses. That is, as long as AC power is maintained, the counter section is reset to 0 before the counter can reach the trigger count.

When the PLD signal is generated, it is applied to both system 12 and to the discharge switch 18. System 12 responds to the PLD signal by calling and executing a routine for transferring critical volatile data to nonvolatile storage before system power is completely lost. The PLD signal causes discharge switch 18 to reset or initialize the Power On Reset generator circuit 20 so that circuit 20 can respond only after a fixed delay period regardless when power is restored. When the power has been restored to a level suitable for system operation, the POR signal will be delivered to system 12 over line 22.

Figure 2:
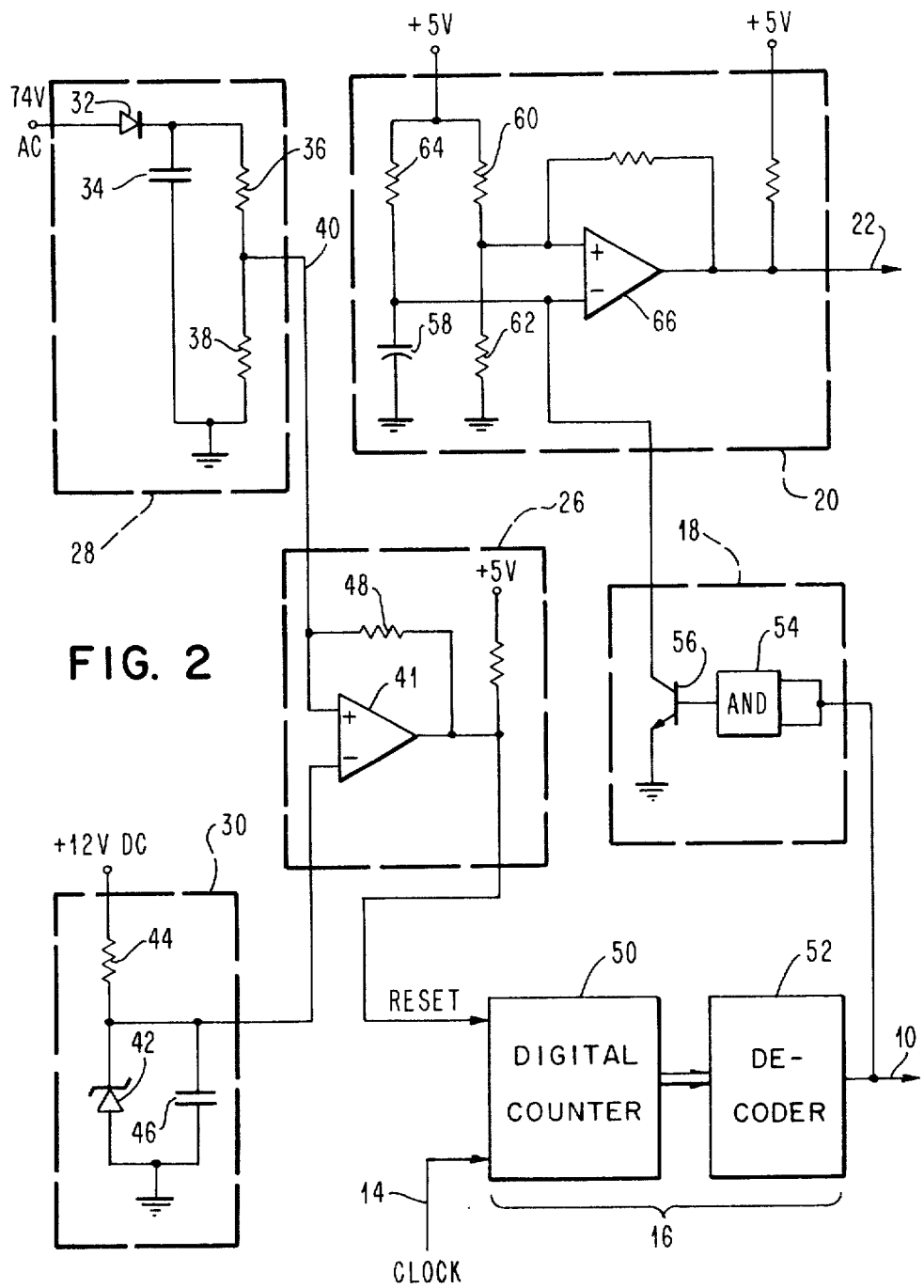
FIG. 2 is a more detailed schematic diagram of selected sections of the circuit shown in block diagram form in FIG. 1.

FIG. 2 shows certain of the functional components described above in more detail. The rectifier/scaler circuit 28 preferably includes a diode 32 acting as a half-wave rectifier for the AC voltage provided, preferably, from a 74-volt peak to peak AC primary power source. Diode 32 is connected both to a noise-suppressing capacitor 34 and to the upper end of a voltage divider consisting of resistors 36 and 38. Both the capacitor 34 and the resistor 38 are connected to a ground in the system. In a preferred embodiment of the invention, the relative values of resistors 36 and 38 are such that the positive going pulse at an output line 40 has a peak amplitude of 12.5 volts under normal power conditions. The positive going pulse is applied to the positive input of a comparator amplifier 41 in the comparator circuit 26. The reference input to comparator amplifier 41 is provided by voltage regulator 30, which includes a Zener diode 42 and a resistor 44 connected in series between a positive DC voltage source and ground. A holding capacitor 46 is connected in parallel with the Zener diode 42. The reverse breakdown voltage of Zener diode 42 is preferably on the order of 6 volts. The diode 42 and holding capacitor 46 cause this voltage to be maintained at the reference input to the comparator amplifier 41.

As indicated earlier, each positive going pulse provided by a rectifier/scaler circuit 28 has a peak amplitude on the order of 12.5 volts under normal power conditions. At least once during each normal cycle of primary AC power, the pulse input to the comparator amplifier 26 exceeds the reference input, causing the amplifier output to go positive. A hysteresis loop including a resistor 48 assures that the switching action will occur rapidly.

The positive going pulse at the output of comparator amplifier 26 provides the reset pulse for a digital counter 50. Digital counter 50 may be a conventional binary counter resettable to a predetermined initial count, such as 0, each time a reset pulse is received. The rate at which the digital counter 50 is incremented is fixed by the frequency of the clock pulse stream provided from the associated data processing system over line 14.

The binary contents of the digital counter 50 are supplied to a decoder circuit 52 which is simply a logic circuit responsive at a predetermined count in counter 50 to provide a positive going output pulse. This predetermined or trigger count is beyond the range of counts normally attained in counter 50 between reset pulses. In a 60 hertz system, reset pulses will normally occur every 16.7 milliseconds. The trigger count would be set at a level which would require a slightly longer period of time to attain. For example, the trigger count might take 21 milliseconds to attain at the frequency of the clock pulses supplied over line 14. As long as the AC power is maintained, the digital counter 50 will never reach the trigger count and the outputs of decoder 52 will remain low. If, however, a cycle of AC power is skipped or if the amplitude of the AC power voltage falls below a certain level, the lack of a reset pulse will allow digital counter 50 to reach the trigger count. The decoder 52 will respond by producing an output pulse on line 10.

The output pulse provides the PLD signal required by system 12. This signal is also applied to both inputs of an AND gate 54 in the discharge switch 18. AND gate 54 drives a transistor 56 in a discharge path for a capacitor 58 is the Power On Reset generator circuit. The Power On Reset generator circuit is conventional and includes a first voltage divider consisting of resistors 60 and 62 as well as a second voltage divider consisting of capacitor 58 and a resistor 64.

When power is restored to a system after an outage, the voltage at the junction of resistors 60 and 62 will rise immediately to a level determined by the relative value of the two resistors and the magnitude of the restored voltage. The voltage at the junction of the capacitor 58 and resistor 64 will rise at a rate determined by the time constant of the capacitor 58 and the resistor 64. After a predetermined period of time, capacitor 58 will charge to a voltage greater than the voltage at the junction of resistors 60 and 62. The output of a comparator amplifier 66 will go low to provide the POR signal on line 22.

During normal circuit operations, capacitor 58 will be fully charged to the potential of the DC supply. In the event of a brief power outage, capacitor 58 may not have time to discharge completely. Under these conditions, the subsequent restoration of power would cause the POR signal to be generated too quickly.

To assure that the POR signal is generated at the right time, the PLD signal is used to initialize or reset the power on reset circuit by immediately discharging capacitor 58 through transistor 56. Regardless of when power is restored to the system, the capacitor 58 must always recharge from 0 potential, assuring that the POR signal will not be generated until a predetermined minimum period of time has elapsed.

The embodiment of the invention described above uses a half-wave rectifier to provide one reset pulse during each full cycle of primary AC power. If desired, the half-wave rectifier could be replaced by a full wave rectifier to provide two reset pulses per cycle of primary AC power. The trigger count would then be adjusted accordingly to provide a PLD signal if AC power is lost for even a half cycle. Conversely, the trigger count could be increased to provide a PLD signal only in the event that AC power was lost for a predetermined number of cycles greater than one cycle. Thus, the circuit can easily be adapted for use with data processing systems having different levels of tolerance to power failures.

Variations and modifications including but not limited to those discussed above will occur to those skilled in the art once they are made aware of the basic concepts of the invention. Therefore, it is intended that the appended claims shall be construed to include not only the embodiments expressly described above, but all other variations and modifications as fall within the true spirit and scope of the invention.

Having thus described my invention, what I claim as new, and desire to secure by Letters Patent is:

1. A power line disturbance detector for a data processing system comprising:
    a comparator circuit for comparing an AC power voltage to a DC reference voltage to produce a reset pulse each time a peak value of the AC voltage exceeds a threshold value established by the DC reference voltage;
    a digital counter having a clock input from an associated data processing system and a reset input from said comparator circuit, said counter being incremented by the system clock and being reset to a predetermined initial count by each reset pulse provided by said comparator circuit; and
    decoder means responsive to a predetermined trigger count in said digital counter to generate a power line disturbance signal, said trigger count being beyond the range of counts attained between normally occurring reset pulses.

2. A power line disturbance detector as defined in claim 1 further including means for rectifying the AC power voltage at the input to said comparator circuit.

3. A power line disturbance detector as defined in claim 2 further including a voltage divider connected to the output of said rectifying means for scaling down the voltage produced by said rectifying means.

4. A power line disturbance detector as defined in claim 3 wherein said comparator circuit comprises a comparator amplifier having a positive input terminal connected to the output of said voltage divider, a negative input terminal connected to the source of DC reference voltage and a feedback path from its output terminal to its positive input terminal.

5. A power line disturbance detector as defined in claim 1 in further combination with a Power On Reset circuit, said detector providing an initializing signal to said Power On Reset circuit to condition said circuit to respond to subsequent restoration of power from a predetermined initial condition.

6. A power line disturbance detector as defined in claim 5 wherein said Power On Reset circuit comprises:
    a comparator amplifier having a feedback loop from its output to its positive input terminal;
    voltage divider means for applying a predetermined percentage of the system power to the positive input terminal of said comparator amplifier;
    a series RC charging circuit having a capacitor connected between the negative input terminal of said comparator amplifier and a system common terminal; and
    a switching means for selectively providing a discharge path for said capacitor, said switching means being controlled by the output from said decoder means.

7. A power line disturbance detector as defined in claim 6 wherein said switching means comprises a transistor having its emitter and collector terminals connected to opposite plates of said capacitor and its base terminal connected in circuit with the output of said decoder means.

8. A power line disturbance detector for a data processing system comprising:

a digital counter having a clock input from a system clock source in said data processing system and a reset input;

means connected to the reset input comprising a comparator amplifier, means for applying a DC reference voltage to a first input to said amplifier, and means for applying a rectified form of system power AC voltage to a second input to said amplifier, said amplifier producing a counter resetting pulse each time the peak value of the applied AC voltage exceeds the threshold value of the applied DC reference voltage; and means connected to said digital counter for detecting that said digital counter has not been reset during a cycle of the AC voltage.

* * * * *